United States Patent
Kuhn et al.

(10) Patent No.: US 8,390,333 B2
(45) Date of Patent: Mar. 5, 2013

(54) ADAPTIVELY BIASED COMPARATOR

(75) Inventors: Rüdiger Kuhn, Freising (DE); Ivanov Vadim V. Vadim Ivanov, Tucson, AZ (US); Frank Dornseifer, Freising (DE); Michael Zwerg, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/204,876

(22) Filed: Aug. 8, 2011

(65) Prior Publication Data
US 2012/0062279 A1    Mar. 15, 2012

(30) Foreign Application Priority Data
Sep. 10, 2010 (DE) .......................... 10 2010 044 925

(51) Int. Cl.
*H03K 5/22* (2006.01)
(52) U.S. Cl. .......................................................... 327/89
(58) Field of Classification Search ................... 327/66, 327/77, 89
See application file for complete search history.

(56) References Cited

U.S. PATENT DOCUMENTS

| | | | | |
|---|---|---|---|---|
| 3,551,696 A | * | 12/1970 | Gray | 327/77 |
| 5,418,483 A | * | 5/1995 | Hiroshi | 327/553 |
| 5,596,291 A | * | 1/1997 | Runas | 327/108 |

* cited by examiner

*Primary Examiner* — Lincoln Donovan
*Assistant Examiner* — William Hernandez
(74) *Attorney, Agent, or Firm* — John R. Pessetto; W. James Brady; Frederick J. Telecky, Jr.

(57) ABSTRACT

The invention relates to an electronic device which comprises a comparator coupled to monitor a first supply voltage level at a first supply voltage node. The comparator comprises a differential input transistor stage having one input coupled to the first supply voltage node and the other input coupled to receive a reference voltage level, a first current source configured to supply a current of a first magnitude, a second current source configured to supply a current of a second magnitude, and a capacitor. The first magnitude is greater than the second magnitude and the first current source is coupled with one side to the differential input stage for supplying the differential input stage and with the other side to a first node. The second current source is coupled with one side to the first node and with the other side to a second supply voltage node having a second supply voltage level and the capacitor is coupled with one side to the first node and with the other side to the first supply voltage node.

3 Claims, 2 Drawing Sheets

ADAPTIVELY BIASED COMPARATOR

FIELD OF THE INVENTION

The invention relates to an electronic device for monitoring a power supply voltage level, and more specifically, to an electronic device comprising a comparator configured to monitor the supply voltage level.

BACKGROUND

Electronic devices, in particular integrated electronic devices provide a complex functionality for all kinds of applications. There is a general need to ensure that the electronic device can operate properly in order to avoid malfunctions or failure. There are many different control and monitoring tasks that may to be implemented for this purpose. One of the most important issues is to ensure that the power supply voltage level of a power supply for supplying the electronic device is within acceptable limits for proper operation of the electronic device. Monitoring circuits like power on reset (POR) circuitry or other solutions may employed, as, for example comparators, which are coupled to the power supply voltage level in order to determine whether or not the power supply voltage level remains within a target window. A major problem of monitoring the supply voltage level are very sudden drops or glitches of the supply voltage level with respect to the delay that is usually induced by the comparator until the electronic device may be eventually shut down. It is therefore necessary to guarantee a sufficiently quick reaction of the monitoring circuit in order to minimize reaction time.

The input or output delay of a comparator usually depends on various factors. One of the main factors is the bias current through the differential input pair of a comparator. This bias current, which is also referred to as tail current for differential input pairs, has to be increased in order to increase the speed of the differential input pair. However, generally increasing the tail current entails an increase of the overall power consumption. Therefore, it is envisaged to increase the bias current only when a quick reaction of the comparator is necessary and turn it down during normal operation. Some mechanisms that have been developed in order to provide this functionality are known as "adaptive biasing techniques". Existing adaptive biasing techniques use, for example, the magnitude of the input voltage difference in order to adapt the tail current of the input stages of amplifiers or comparators through additional amplifier stages. However, this approach also contributes some delay to the automatic adaptation process and makes the circuitry much more complex.

SUMMARY

It is an object of the invention to provide an electronic device that is configured to adapt the bias current of a comparator without adding additional delay or increasing the complexity of the circuitry.

According to an aspect of the invention, an electronic device is provided which comprises a comparator that is coupled to monitor a first supply voltage level at a first supply voltage node. The comparator comprises a differential input pair of transistors, also herein referred to as the differential input stage. One input of the differential input stage may then be coupled to the first supply voltage node. The input of a differential input stage may typically be the control gate terminal of one transistor of the differential input stage of transistors. The other input of the differential input stage (i.e. the control gate of the other transistor of the differential input stage) may then be coupled to receive a reference voltage level. The comparator is then configured to compare the voltage level at the first supply voltage node (or a voltage level that is more or less directly derived from the supply voltage level which is present at the first supply voltage node) with the reference voltage level on the other input node of the differential input stage. The differential input stage may then be biased by at least two current sources which are configured to provide a bias current or tail current to the differential input stage, i.e. to the two transistors of the differential input stage of the comparator. A first current source may then be configured to supply a current of a first magnitude. A second current source may be configured to supply a current of a second magnitude. The first and the second current sources may be coupled in series so that the current through a series of currents of the first and second currents source is dominated by the current source having the smaller current, i.e. the current with the smaller magnitude. There may also be a capacitor coupled with one side to the node between the first and the second current source and with another side to the first supply voltage node. The magnitude of the current of the first current source may then be greater than the magnitude of the current of the second current source. The first current source can be coupled with one side to the differential input stage for supplying the differential input stage and with the other side to a first node. The second current source may be coupled with one side to the first node and with the other side to ground or any other supply voltage node having another supply voltage level (this supply voltage level being lower than the first supply voltage level in normal operation). The capacitor may then be coupled with one side to the first node and with the other side to the first supply voltage node. This configuration provides that the tail current or bias current of the differential stage of the comparator becomes a function of the input signal, i.e. more specifically as a function of the first derivative or rate of change of the supply voltage level at the first supply voltage node. Due to the smaller magnitude of the second current source, the bias or tail current of the differential pair is kept at a low magnitude during normal operation. In normal operation the magnitude of the tail current is independent of input level since it is the rate of change of the first supply voltage level that matters. As soon as the supply voltage level at the first supply voltage node drops, the current source with the greater magnitude dominates and the bias current is increased. The bias current through the differential input stage increases as a function of the dropping rate of the supply voltage level at the first supply voltage node. This configuration results in comparatively low delays of down to one ns for equally fast input voltage drops. This also provides that short circuit events at the first supply voltage node can be detected instantaneously.

According to an aspect of the invention, the comparator may be supplied from a different supply voltage domain with respect to the first supply voltage level at the first supply voltage node. The comparator is then configured to react on the voltage drop even if the first supply voltage level at the first supply voltage node becomes too small.

In another aspect of the invention, the output of the capacitor can be coupled to control a voltage regulator which may be coupled to the first supply voltage node. The comparator may then be configured to control the output voltage of the voltage regulator in response to the supply voltage level at the first supply voltage node. The output of the voltage regulator may then be switched off or switched into a high ohmic state in response to the output signal of the comparator if the first supply voltage level drops below a threshold level. Therefore, the supply voltage domain at the output of the voltage regulator may be isolated instantaneously if the supply voltage level at the first supply voltage node drops. The delay through the comparator is very small as the bias current of the comparator is increased as a function of the dropping rate of the supply voltage level at the first supply voltage node.

In another aspect of the invention, the electronic device may comprise a ferroelectric random access memory (Fe-RAM). It may then be supplied by the output voltage of the voltage regulator. This provides that the voltage domain at the output of the voltage regulator can immediately be decoupled from the voltage domain of the first supply voltage level, if a failure of the first supply voltage level occurs. This is particularly useful for applications where a ferroelectric random access memory is used. Since the memory content of an FeRAM is destroyed during a read cycle, it has to be guaranteed under all circumstances that each read cycle can be followed by a complete write (write-back) cycle in order to preserve the data stored in the FeRAM. The background for this is that a read access to an FeRAM cell depolarizes the dielectric and erases the content. Therefore, each read access must be followed by a write-back cycle. For guaranteeing memory integrity, the data write-back needs to be ensured even when the supply voltage fails (tear protection). Therefore, the supply domain for the FeRAM is advantageously chip internal (not directly connected with the first supply voltage), which avoids external hard shorts. If the first supply voltage level at the first supply voltage node fails, the output of the voltage regulator may be switched into a high ohmic state by the output signal of the comparator implemented in accordance with aspects of the invention. This serves to decouple the second supply voltage domain (at the output of the voltage regulator) and enables to preserve the supply voltage for the FeRAM. A buffer capacitor may be coupled to buffer the second supply voltage. The buffer capacitor may then serve to supply the necessary amount of energy to the FeRAM in order to complete the write-back cycle following the read cycle of the FeRAM even in a situation in which the voltage regulator is switched off due to failure of the first supply voltage.

BRIEF DESCRIPTION OF DRAWINGS

Further aspects of the invention will ensue from following description of a preferred embodiment of the invention with reference to the accompanying drawings, wherein

FIG. 1 shows a simplified circuit diagram of a comparator implemented according to aspects of the invention. There is a differential input stage of transistors M1, M2. In this embodiment, transistors M1 and M2 are NMOS transistors. As usual for a differential pair of transistors, the transistors M1, M2 of the differential input stage are coupled at one side of the channels. Accordingly, the sources of transistors M1 and M2 are coupled together. The drains of transistors M1 and M2 may be coupled to a load stage or other stages of the comparator which are not shown. Several possibilities and configurations exist for the load stage which are known to the person skilled in the art. The sources of transistors M1, M2 of the differential input stage are coupled to the drain of transistor M3 which is configured as the first current source. A tail current or bias current ITAIL is drawn from the common source node of transistors M1 and M2 for biasing the differential input stage and defining the reaction time of the differential pair. The source of transistor M3 is coupled to the drain of transistor M4 at node N1. Transistor M4 operates as the second current source. The source of transistor M4 is coupled to ground or any other supply voltage level lower than the first supply voltage level DVDD present at node N2. The currents through transistor M3 and M4 are basically defined by the width to length ratio of the channels and the current mirror configurations provided by transistors M5 and M6. Accordingly, there is a first current mirror of transistors M5 and M3 for supplying a current IBOOST. There is a second current mirror M6, M4 which is configured to provide current IQ through transistor M4. IQ is much smaller than IBOOST. This means that the magnitude of the current through transistor M3 (first current source) is greater than the magnitude of the current IQ through transistor M4 (the second current source). The first current source (M3) and the second current source (M4) are coupled in series. This configuration is also known and referred to as cascode, wherein transistor M3 is the cascode device. Therefore, the current through the two current sources M3 and M4 is dominated by current source M4, so that only the smaller current IQ is drawn from the differential input pair under normal operating conditions, i.e. while DVDD (first supply voltage level) does not change, i.e. is static. Accordingly, the differential input stage M1, M2 is biased with a very small current IQ and has therefore a rather long reaction time. The currents through transistors M5 and M6 are defined by a current source IB which feeds a current to the diode-coupled transistors M5 and M6. The ratio of the currents IBOOST and IQ can then be defined by the mirroring factors of M5 and M3 as well as M6 and M4. A capacitor CP is coupled to the first node N1 between transistors M3 and M4. One side of capacitor CP is coupled to the source of M3 and to the drain of M4 at node N1. The other side of capacitor CP is coupled to the first apply voltage node N2, i.e. to the first supply voltage level DVDD. A resistive divider of resistors R1 and R2 is also coupled to the first supply voltage node N2. Node N3 between resistor R1 and R2 is coupled to the control gate of transistor M1 of the differential input stage. The control gate of the other transistor M2 of the differential input stage is coupled to receive a reference voltage level. The voltage level at node N3 (the node between resistors R and R2) is then an indicator of the voltage level of DVDD at the first supply voltage node N2. Coupling the comparator input voltage through the capacitor to the source of the cascode device M3 leads to a relationship between the tail current and the rate of change of the input voltage of $$ITAIL = CPval \cdot dv/dt,$$

wherein CPval is the capacitance value of capacitor CP and V is the voltage level DVDD at the first supply voltage node N2. The tail current ITAIL increases with the drop rate dV/dt of the input voltage DVDD multiplied by the capacitance value of the capacitor CP. In response to the voltage drop, the tail current ITAIL increases which enhances the speed of the circuit. The output voltage OUT1 changes if the level of the voltage at node N3 falls below VREF. Due to the capacitor CP coupled between N2 and N1, the comparator delay is substantially reduced if the voltage level at the first supply voltage node N2 (the first supply voltage level DVDD) drops. A delay of approximately 1 ns may be achieved with the comparator. Short circuit events at node N2 (supply voltage level DVDD suddenly drops) may then instantaneously be detected.

Figure 1:
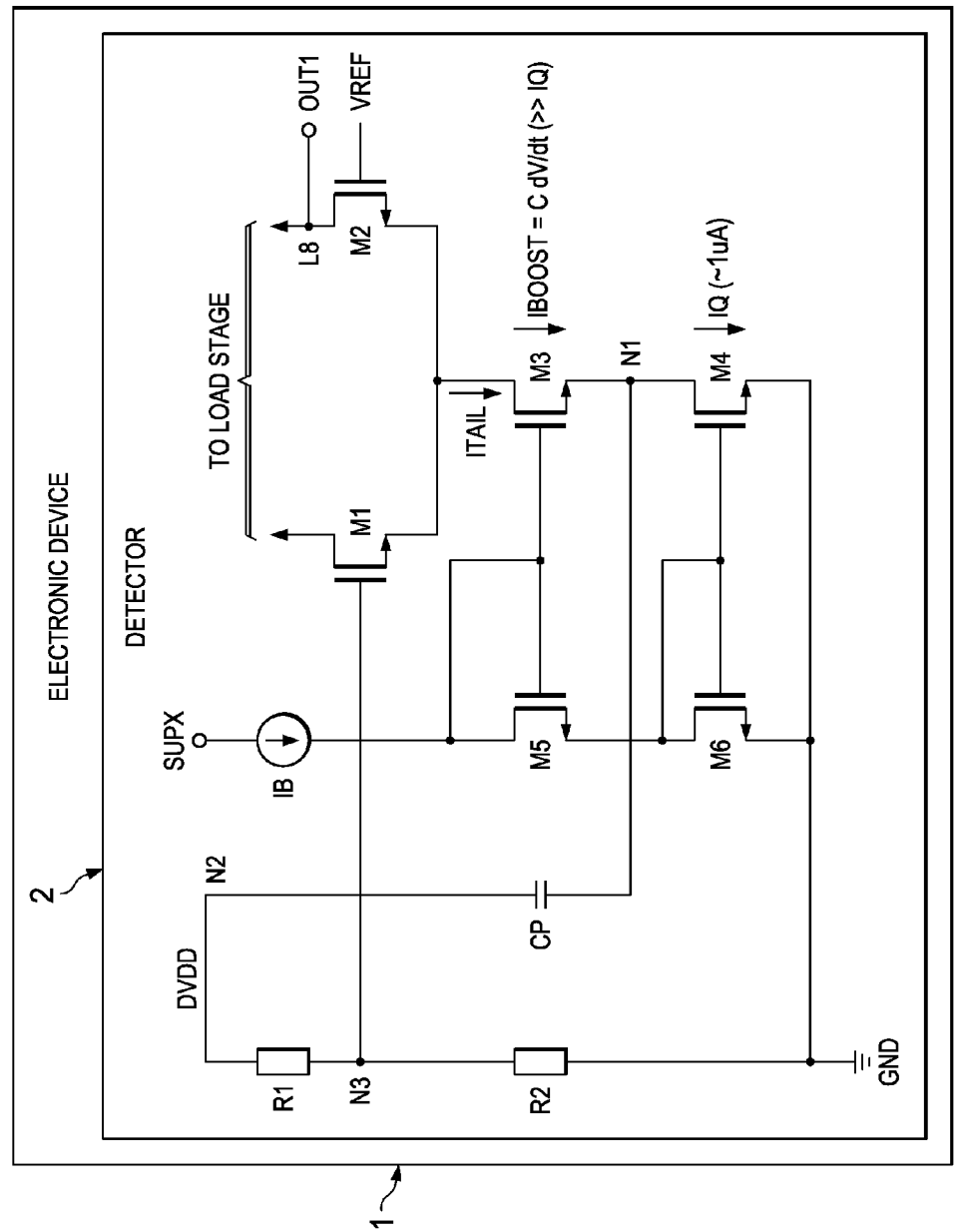
FIG. 1 shows a simplified circuit diagram of a comparator according to an embodiment of the invention.
Figure 2:
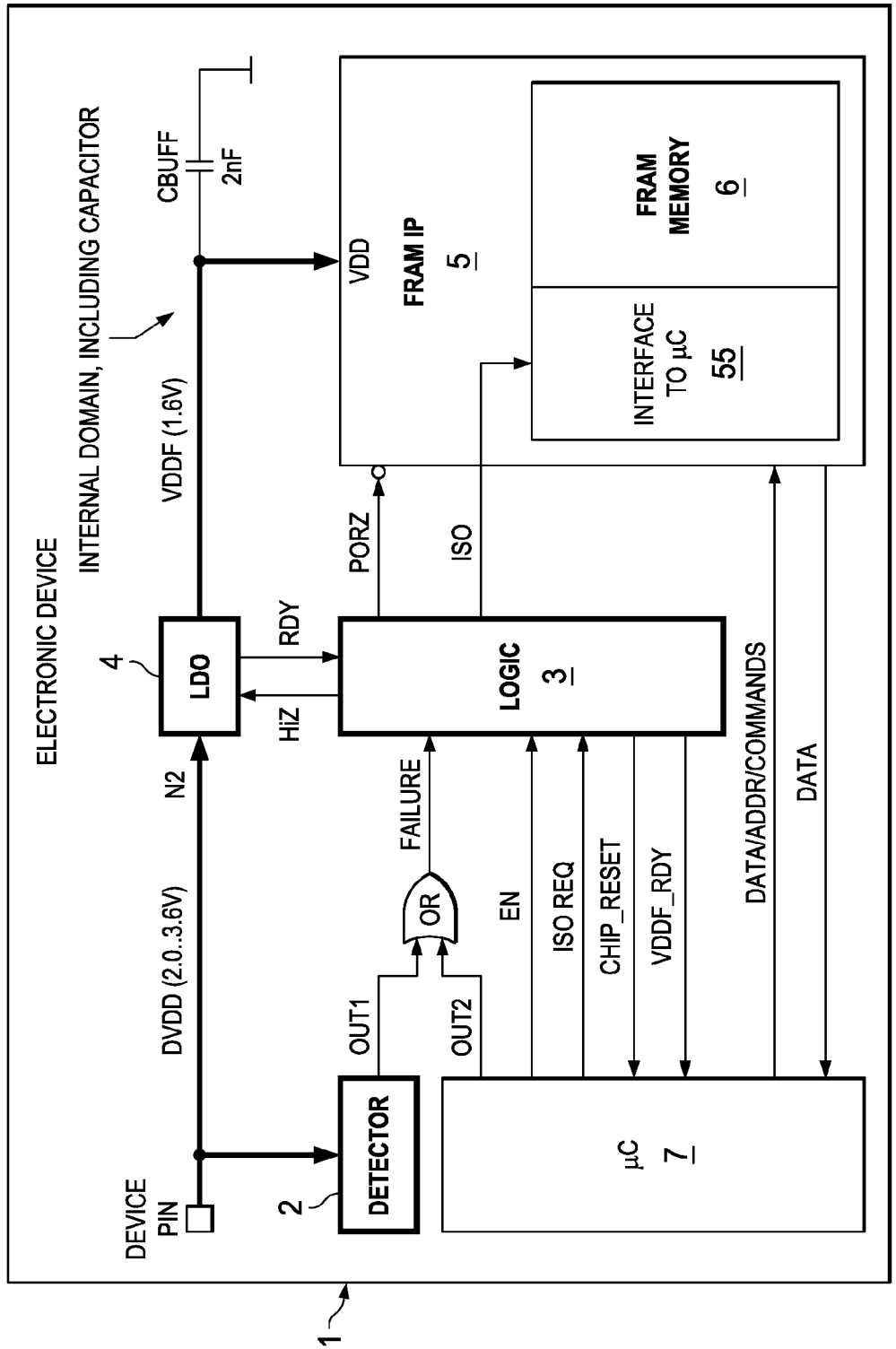
FIG. 2 shows a system with a FeRAM in which the comparator according to aspects of the invention can advantageously be employed.

FIG. 2 shows a simplified circuit and block diagram of a system using the comparator according to aspects of the invention. The system includes the DETECTOR 2 which basically comprises the circuit shown in FIG. 1. There is further an FeRAM memory device 5 which is supplied in an internal second supply voltage domain having a supply voltage level VDDF. The supply voltage level VDDF (second supply voltage level) may be 1.6 Volt. The FeRAM includes memory 6 and an interface for receiving and transmitting data and/or control information. The control circuitry of the FeRAM 5 can be initialized through a signal PORZ. Furthermore, there might be an isolation signal ISO for switching the interface of the FeRAM memory 6 into high ohmic state. The second supply voltage level VDDF of the second supply voltage domain is buffered by a capacitor CBUF. This capacitor CBUF may for example have a capacitance value of 2 nF. Furthermore there is a voltage regulator LDO 4, and a logic 3. The comparator is referred to as detector 2 and coupled to the first supply voltage level DVDD at node N2. The first supply voltage level DVDD may have a voltage range from 2 to 3.6 Volt. Furthermore, there might be a microcontroller μC 7. The output OUT1 of the detector 2 (the output OUT1 of the comparator shown in FIG. 1) is then coupled to an input of an OR gate OR. The other input of the OR gate OR is coupled to an output OUT2 of the μC 7. The output of the OR gate provides the signal FAILURE which indicates, if triggered by signal OUT1, that the first supply voltage level DVDD at node N2 is below a threshold level, which is detected by DETECTOR 2. Accordingly, the logic 3 receives the failure signal FAILURE from either the μC 7 or DETECTOR 2 through the OR gate and if either of the two stages DETECTOR 2 or μC 7 issues the respective failure signal, LOGIC stage 3 can switch the voltage regulator LDO 4 into a high ohmic state through signal HiZ. the voltage regulator LDO 4 may issue a signal RDY which signals that the LDO is ready to supply current after it has been enabled. Accordingly, in response to a failure of the first supply voltage level DVDD, the output of the voltage regulator LDO 4 may be switched immediately into a high ohmic state. This isolates the second supply voltage domain (internal domain with supply voltage level VDDF) and the FRAM 5 may only be supplied by the charge stored on buffer capacitor CBUFF. This amount of charge (or energy) is just sufficient for finishing a complete write-back cycle. The signals issued by logic 3 may then be the power on reset signal PORZ and the isolation signal ISO for isolating and switching down the FeRAM. The signal PORZ is asserted after a delay which is sufficiently long to let the FeRAM complete an ongoing access cycle. Assertion of the signal PORZ initializes the control circuitry in the FeRAM DETECTOR 2 (comprising the capacitor shown in FIG. 1) may also be supplied by a different supply voltage, different from the first supply voltage level DVDD. There are various further signals EN, ISO-REQ, CHIP-RESET and VDDF-RDY transmitted between logic stage 3 and μC 7 which serve to enable logic 3 (EN) request isolation of the interface of the FRAM (ISO-REQ), reset μC 7 (CHIP-RESET) and inform μC 7 that the internal (second) supply voltage level VDDF is ready (VDDF-RDY). The output signal of the comparator is then signal OUT1. The comparator and the capacitor are part of DETECTOR 2. In this embodiment, DETECTOR 2 may be one of several stages of an electronic device 1, which may be an integrated electronic device. The electronic device 1 shown in FIG. 2 is a complete system that benefits substantially from DETECTOR 2 including the comparator shown in FIG. 1.

The FeRAM 5 supply voltage VDDF is buffered with an integrated capacitor CBUFF of 2 nF. The capacitor CBUFF holds a charge reserve at all times to complete an ongoing memory access, including write-back, even when the LDO 4 (voltage regulator is cut off). A detector circuit DETECTOR 2 at the input node N2 of the LDO 4 constantly monitors the overall chip supply for DVDD at node N2. The FeRAM 5 is designed to perform self-timed memory access without interaction with the microcontroller μC 7. If the input voltage DVDD fails, the interface 55 of the FeRAM 5 to the μC 7 is isolated, suppressing further memory access requests. Additionally, the LDO 4 is disconnected from the internal supply (second voltage domain VDDF), leaving the buffer capacitor CBUFF as the only source for completing an ongoing memory access. At the same time, the microcontroller μC 7 can be reset. For the detector circuit DETECTOR 2, a very fast response time is required. In order to achieve this fast response, without spending too much additional power, the new adaptive biasing scheme for the differential input stage of the comparator is provided. The current mirrors M5 and M3, as well as M6 and M4 generally provide a low biasing current through the input stage M1, M2, of the comparator as long as the first voltage level rises or remains constant. The capacitor CP, which is coupled between node N2 and the source of the cascode device M3 increases the comparators tail current (ITAIL) when the input voltage drops. Comparator delays in the range of 1 ns may then be achieved while the quiescent current of the comparator can be as low as 1 mA.

Although the invention has been described hereinabove with reference to a specific embodiment, it is not limited to this embodiment and no doubt further alternatives will occur to the skilled person that lie within the scope of the invention as claimed.

What is claimed is:

1. An electronic device comprising a comparator coupled to monitor a first supply voltage level at a first supply voltage node, the comparator comprising a differential input transistor stage having one input coupled to the first supply voltage node and the other input coupled to receive a reference voltage level, a first current source configured to supply a current of a first magnitude, a second current source configured to supply a current of a second magnitude, and a capacitor wherein the first magnitude is greater than the second magnitude and the first current source is coupled with one side to the differential input transistor stage for supplying the differential input transistor stage and with the other side to a first node, the second current source is coupled with one side to the first node and with the other side to a second supply voltage node having a second supply voltage level and the capacitor is coupled with one side to the first node and with the other side to the first supply voltage node.

2. The electronic device according to claim 1, wherein an output of the capacitor is coupled to control a voltage regulator coupled to the first supply voltage node in response to the first supply voltage level, so as to switch an output of the voltage regulator into a high ohmic state if the first supply voltage level drops below a threshold level.

3. The electronic device according to claim 2, further comprising a ferroelectric random access memory (FeRAM) which is supplied by the voltage regulator.

* * * * *